United States Patent
Chang et al.

(10) Patent No.: US 8,518,549 B2
(45) Date of Patent: Aug. 27, 2013

(54) METHOD FOR MAKING COATED ARTICLE AND COATED ARTICLE

(75) Inventors: Hsin-Pei Chang, New Taipei (TW); Wen-Rong Chen, New Taipei (TW); Huann-Wu Chiang, New Taipei (TW); Cheng-Shi Chen, New Taipei (TW); Jia Huang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 24 days.

(21) Appl. No.: 13/247,022

(22) Filed: Sep. 28, 2011

(65) Prior Publication Data

US 2012/0258304 A1  Oct. 11, 2012

(30) Foreign Application Priority Data

Apr. 6, 2011  (CN) .......................... 2011 1 0084827

(51) Int. Cl.
  *B32B 15/04* (2006.01)
  *B32B 17/06* (2006.01)

(52) U.S. Cl.
  USPC ........... 428/432; 428/688; 428/689; 428/699; 428/701; 428/702

(58) Field of Classification Search
  USPC .................. 428/428, 689, 699, 702, 432, 701
  See application file for complete search history.

(56) References Cited

U.S. PATENT DOCUMENTS

| | | | |
|---|---|---|---|
| 2001/0018393 A1* | 8/2001 | Nagashima et al. | 501/64 |
| 2002/0061809 A1* | 5/2002 | Aronica et al. | 501/24 |
| 2012/0183805 A1* | 7/2012 | Chang et al. | 428/632 |
| 2012/0315468 A1* | 12/2012 | Chiang et al. | 428/336 |
| 2012/0315501 A1* | 12/2012 | Chiang et al. | 428/649 |
| 2013/0029095 A1* | 1/2013 | Chen et al. | 428/141 |
| 2013/0029096 A1* | 1/2013 | Chang et al. | 428/141 |

FOREIGN PATENT DOCUMENTS

JP   2007-254853   * 10/2007

OTHER PUBLICATIONS

JP-2007-254853 English machine translation.*
JP-2007-254853 Abstract.*
JP2007254853 Human translation.*

* cited by examiner

*Primary Examiner* — David Sample
*Assistant Examiner* — Lauren Colgan
(74) *Attorney, Agent, or Firm* — Altis Law Group, Inc.

(57) ABSTRACT

A method for making a coated article includes: providing a substrate; forming a prefabricated layer on a surface of the substrate by vacuum sputtering, the prefabricated layer being a metal layer containing the metal element 'N', or an unsaturated oxide layer containing the metal element 'N' and 'M', the 'N' being one or more metals selected from a group consisting of titanium, aluminum, and zinc, the 'M' being calcium, barium, or a mixture of calcium and barium; and thermal oxidizing the prefabricated layer to form a color layer on the substrate, the color layer being an oxide layer of the metal element 'N', or an oxide layer of the metal element 'N' and 'M'. The color value of the color layer has a L* coordinate between 91 and 98, an a* coordinate between −1 and 1, and a b* coordinate between −2 and 2 in the CIE LAB color system.

5 Claims, 3 Drawing Sheets

METHOD FOR MAKING COATED ARTICLE AND COATED ARTICLE

BACKGROUND

1. Technical Field

The present disclosure relates to methods for making coated articles, especially to a method for making a coated article having a white color and a coated article made by the method.

2. Description of Related Art

To decorate housings of electronic devices, decorative layers may be formed on the housings by anodizing, painting, or vacuum depositing. However, the anodizing and painting processes are not environmentally friendly, and decorative layers formed by vacuum depositing may not have rich colors.

Therefore, there is room for improvement within the art.

BRIEF DESCRIPTION OF THE FIGURES

Many aspects of the disclosure can be better understood with reference to the following figures. The components in the figures are not necessarily drawn to scale, the emphasis instead being placed upon clearly illustrating the principles of the disclosure. Moreover, in the drawings like reference numerals designate corresponding parts throughout the several views.

DETAILED DESCRIPTION

Figure 1:
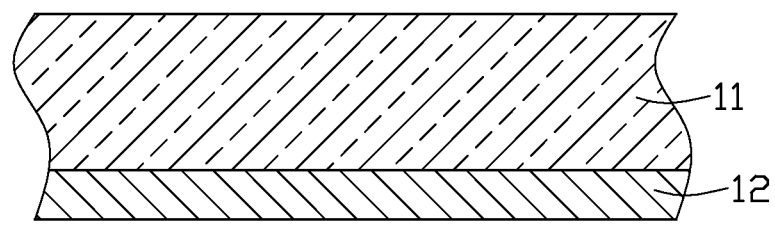
FIG. 1 is a cross-sectional view of an exemplary embodiment of a substrate and a prefabricated layer.
Figure 2:
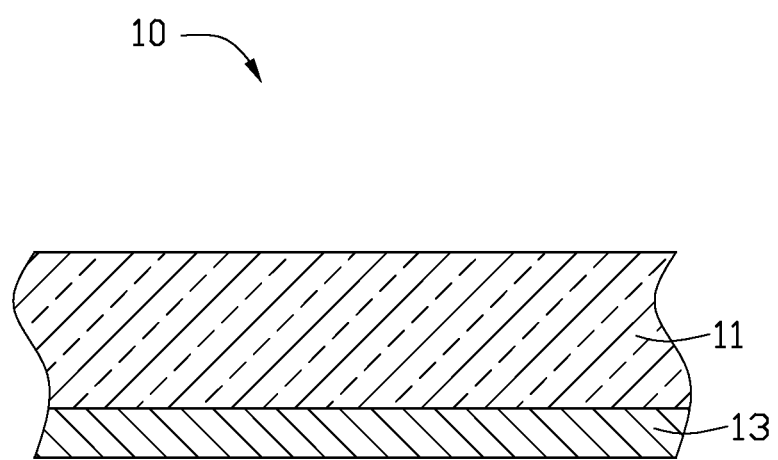
FIG. 2 is a cross-sectional view of an exemplary embodiment of a coated article.

Referring to FIG. 1 and FIG. 2, according to an exemplary embodiment, a method for making a coated article 10 may include the following steps:

A substrate 11 is provided. The substrate 11 may be transparent and made of glass, for example.

The substrate 11 is pre-treated. The pre-treating process may include cleaning contaminants from the substrate 11, and rinsing the substrate 11 in deionized water and then drying.

A prefabricated layer 12 is sputtered on the pretreated substrate 11. The prefabricated layer 12 may be a metal layer containing the metal element 'N', or an unsaturated oxide layer containing the metal element 'N' and the metal element 'M'. The metal element 'N' may be one or more metals selected from a group consisting of titanium (Ti), aluminum (Al), and zinc (Zn). The metal element 'M' may be calcium (Ca), barium (Ba), or a mixture of Ca and Ba.

Figure 3:
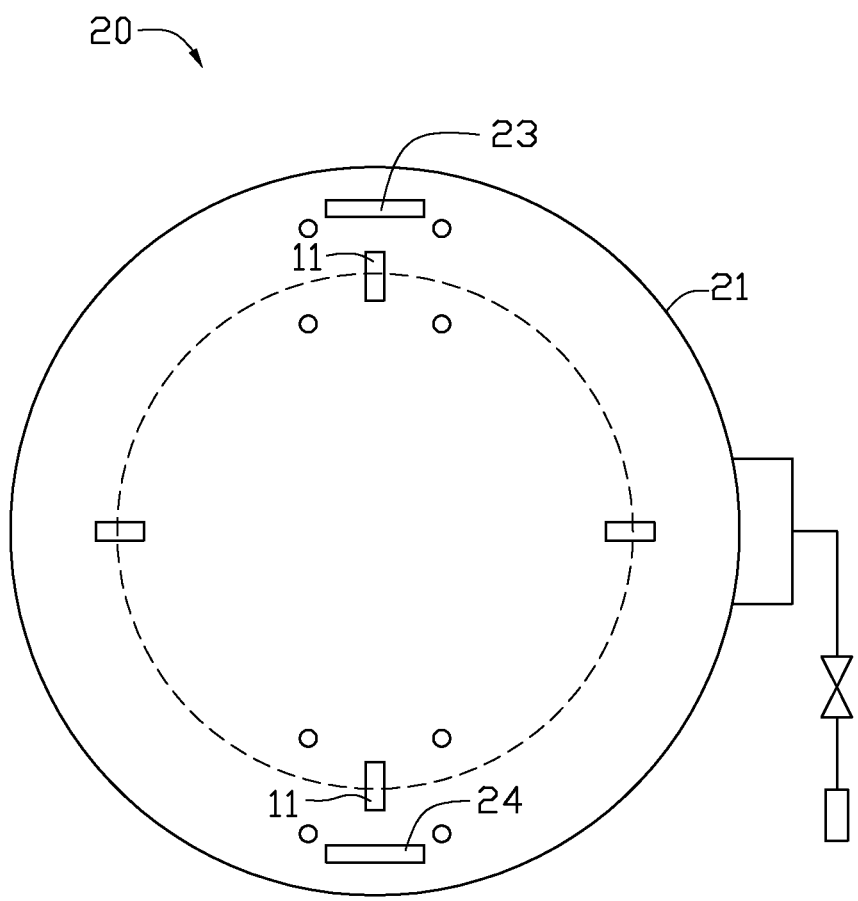
FIG. 3 is a schematic view of an exemplary embodiment of a vacuum sputtering device.

Referring to FIG. 3, the substrate 11 may be positioned in a coating chamber 21 of a vacuum sputtering device 20. The coating chamber 21 is fixed with a metal target 23 and a ceramic target 24. The metal target 23 may be made of one or more metals selected from a group consisting of Ti, Al, and Zn. The ceramic target 24 is made of calcium oxide (CaO), barium oxide (BaO), or a mixture of CaO and BaO.

The coating chamber 21 is then evacuated to about $8.0 \times 10^{-3}$ Pa. Argon (Ar) gas having a purity of about 99.999% may be used as a working gas and is fed into the coating chamber 21 at a flow rate of about 300 standard-state cubic centimeters per minute (sccm) to about 500 sccm. The inside of the coating chamber 21 may be heated to about 100° C.-300° C. When the prefabricated layer 12 is a metal layer, a power of about 2.5 kilowatt (kW)-4.5 kW is applied on the metal target 23 to deposit the prefabricated layer 12. When the prefabricated layer 12 is an unsaturated oxide layer, a power of about 2.5 kW-4.5 kW and a power of about 3 kW-4.5 kW at a radio frequency are respectively applied on the metal target 23 and the ceramic target 24 to deposit the prefabricated layer 12. During the depositing process, the substrate 11 may have a bias voltage of about −200 V to about 0 V. Depositing of the prefabricated layer 12 may take about 1 hour-4 hours.

After the prefabricated layer 12 is formed, the feeding of the argon gas into the coating chamber 21 is stopped, the power applied on the metal target 23 and the power applied on the ceramic target 24 are stopped, and the bias voltage to the substrate 11 is also stopped. The inside of the coating chamber 21 is then heated to about 300° C.-600° C., and oxygen ($O_2$) at a flow rate of about 80 sccm-150 sccm is fed into the coating chamber 21 to thermally oxidize the prefabricated layer 12 and form a color layer 13 having a white color on the substrate 11. The color layer 13 is an oxide layer of the metal element 'N', or an oxide layer of the metal element 'N' and 'M'. The color layer 13 has a thickness of about 1 μm-2 μm.

The process of thermal oxidizing the prefabricate layer 12 can also be carried out in an oven.

The color value of the color layer 13 of the exemplary embodiment has been tested. The test indicated that the color value of the color layer 13 had, in the CIE (international commission on illumination) LAB color system, a L* coordinate between 91 and 98, an a* coordinate between −1 and 1, and a b* coordinate between −2 and 2. When the test is tested on the substrate 11, the L* coordinate is between 85 and 90, the a* coordinate is between −2 and 1, and the b* coordinate is between −2 and 2. Thus, the coated article 10 presents a bright white appearance whether being observed through the substrate 11 or from the color layer 13.

The substrate 11 can also be opaque and made of metal.

A coated article 10 formed by the exemplary method includes the substrate 11, and the color layer 13 formed on a surface of the substrate 11.

Specific examples of making the coated article are described as follows. The pre-treating process in these specific examples may be substantially the same as described above, so it is not described here again. Additionally, the processes of sputtering the prefabricate layer 12 and forming the color layer 13 in the specific examples are substantially the same as described above, and the specific examples merely emphasize the different parameters in the different processes of making the coated article 10.

Example 1

The substrate 11 is made of glass.

Sputtering to form the prefabricated layer 12 on the substrate 11: the flow rate of Ar is 400 sccm, the substrate 11 has a bias voltage of −80 V; uses the metal target 23, the metal target 23 is made of zinc and applied with a power of 4 kW; sputtering of the prefabricate layer 12 takes 120 min.

Thermal oxidizing the prefabricate layer 12 to form the color layer 13: the inside of the coating chamber 21 is heated to 500° C.; the flow rate of the oxygen is 120 sccm; thermal oxidizing the prefabricated layer 12 takes 45 min.

The color layer 13 has a thickness of 1.68 μm. The color value of the color layer 13 has, in the CIE LAB color system, a L* coordinate of 95, an a* coordinate of 0.52, and a b* coordinate of −0.35. When the test is tested on the substrate 11, the L* coordinate is 87, the a* coordinate is −1.07, and the b* coordinate is −0.85.

Example 2

The substrate 11 is made of glass.

Sputtering to form the prefabricated layer 12 on the substrate 11: the flow rate of Ar is 400 sccm, the substrate 11 has a bias voltage of −100 V; uses the metal target 23 and the ceramic target 24, the metal target 23 is made of zinc and applied with a power of 4 kW, the ceramic target 24 is made of calcium oxide and applied with a power of 4 kW; sputtering of the prefabricate layer 12 takes 120 min.

Thermal oxidizing the prefabricate layer 12 to form the color layer 13: the inside of the coating chamber 21 is heated to 500° C.; the flow rate of the oxygen is 100 sccm; thermal oxidizing the prefabricated layer 12 takes 50 min.

The color layer 13 has a thickness of 1.8 μm. The color value of the color layer 13 has, in the CIE LAB color system, a $L^*$ coordinate of 97, an $a^*$ coordinate of 0.27, and a $b^*$ coordinate of −0.15. When the test is tested on the substrate 11, the $L^*$ coordinate is 88.5, the $a^*$ coordinate is −0.97, and the $b^*$ coordinate is −0.45.

Example 3

The substrate 11 is made of glass.

Sputtering to form the prefabricated layer 12 on the substrate 11: the flow rate of Ar is 400 sccm, the substrate 11 has a bias voltage of −100 V; uses the metal target 23, the metal target 23 is made of titanium and applied with a power of 3.5 kW; sputtering of the prefabricate layer 12 takes 100 min.

Thermal oxidizing the prefabricate layer 12 to form the color layer 13: the inside of the coating chamber 21 is heated to 550° C.; the flow rate of the oxygen is 120 sccm; thermal oxidizing the prefabricated layer 12 takes 50 min.

The color layer 13 has a thickness of 1.12 μm. The color value of the color layer 13 has, in the CIE LAB color system, a $L^*$ coordinate of 96.5, an $a^*$ coordinate of −0.67, and a $b^*$ coordinate of 0.11. When the test is tested on the substrate 11, the $L^*$ coordinate is 87.2, the $a^*$ coordinate is −1.17, and the $b^*$ coordinate is 0.53.

Example 4

The substrate 11 is made of glass.

Sputtering to form the prefabricated layer 12 on the substrate 11: the flow rate of Ar is 350 sccm, the substrate 11 has a bias voltage of −100 V; uses the metal target 23, the metal target 23 is made of aluminum and applied with a power of 3.5 kW; sputtering of the prefabricate layer 12 takes 100 min.

Thermal oxidizing the prefabricate layer 12 to form the color layer 13: the inside of the coating chamber 21 is heated to 400° C.; the flow rate of the oxygen is 100 sccm; thermal oxidizing the prefabricated layer 12 takes 45 min.

The color layer 13 has a thickness of 1.35 μm. The color value of the color layer 13 has, in the CIE LAB color system, a $L^*$ coordinate of 95.7, an $a^*$ coordinate of 0.01, and a $b^*$ coordinate of −0.75. When the test is tested on the substrate 11, the $L^*$ coordinate is 86.5, the $a^*$ coordinate is 0.42, and the $b^*$ coordinate is −1.65.

Example 5

The substrate 11 is made of glass.

Sputtering to form the prefabricated layer 12 on the substrate 11: the flow rate of Ar is 400 sccm, the substrate 11 has a bias voltage of −100 V; uses the metal target 23 and the ceramic target 24, the metal target 23 is made of zinc and applied with a power of 4 kW, the ceramic target 24 is made of barium oxide and applied with a power of 3.5 kW; sputtering of the prefabricate layer 12 takes 120 min.

Thermal oxidizing the prefabricate layer 12 to form the color layer 13: the inside of the coating chamber 21 is heated to 580° C.; the flow rate of the oxygen is 120 sccm; thermal oxidizing the prefabricated layer 12 takes 45 min.

The color layer 13 has a thickness of 1.91 μm. The color value of the color layer 13 has, in the CIE LAB color system, a $L^*$ coordinate of 98, an $a^*$ coordinate of 0.01, and a $b^*$ coordinate of 0.08. When the test is tested on the substrate 11, the $L^*$ coordinate is 89.2, the $a^*$ coordinate is 0.29, and the $b^*$ coordinate is −0.35.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A coated article, comprising:
    a substrate; and
    a color layer formed on a surface of the substrate, the color layer being an oxide layer of the metal element 'N' and the metal element 'M'; the metal element 'N' being at least one metal selected from a group consisting of titanium and zinc, the metal element 'M' being calcium, barium, or a mixture of calcium and barium, the color value of the color layer having a $L^*$ coordinate between 91 and 98, an $a^*$ coordinate between −1 and 1, and a $b^*$ coordinate between −2 and 2 in the CIE LAB color system.

2. The coated article as claimed in claim 1, the color layer having a thickness of about 1 μm-2 μm.

3. The coated article as claimed in claim 1, the color layer being white.

4. The coated article as claimed in claim 1, wherein color value tested on the substrate has a $L^*$ coordinate between 85 and 90, an $a^*$ coordinate between −2 and 1, and a $b^*$ coordinate between −2 and 2 in the CIE LAB color system.

5. The coated article as claimed in claim 1, the substrate being transparent and made of glass.

* * * * *